US012634624B2

(12) United States Patent
Yang et al.

(10) Patent No.: US 12,634,624 B2
(45) Date of Patent: May 19, 2026

(54) SPEAKER AND ROLLABLE ELECTRONIC DEVICE

(71) Applicant: AAC Microtech (Changzhou) Co., Ltd., Changzhou City (CN)

(72) Inventors: Huhu Yang, Shenzhen (CN); Wei Wei, Shenzhen (CN); Zhaoyu Yin, Shenzhen (CN)

(73) Assignee: AAC Microtech (Changzhou) Co., Ltd., Changzhou City (CN)

( * ) Notice: Subject to any disclaimer, the term of this patent is extended or adjusted under 35 U.S.C. 154(b) by 0 days.

(21) Appl. No.: 17/914,363

(22) PCT Filed: Aug. 11, 2022

(86) PCT No.: PCT/CN2022/111791
§ 371 (c)(1),
(2) Date: Sep. 26, 2022

(87) PCT Pub. No.: WO2024/021169
PCT Pub. Date: Feb. 1, 2024

(65) Prior Publication Data
US 2025/0150755 A1     May 8, 2025

(30) Foreign Application Priority Data

Jul. 26, 2022     (CN) ......................... 202221939666.X

(51) Int. Cl.
*H04R 1/28* (2006.01)
*H05K 5/02* (2006.01)
*H05K 5/00* (2006.01)

(52) U.S. Cl.
CPC ......... *H04R 1/2857* (2013.01); *H05K 5/0217* (2013.01); *H04R 2499/11* (2013.01); *H05K 5/0086* (2013.01)

(58) Field of Classification Search
CPC ...... H04R 1/2857; H04R 1/2807; H04R 1/28; H04R 1/403; H04R 1/345; H04R 1/30;
(Continued)

(56) References Cited

U.S. PATENT DOCUMENTS 7,870,928 B1 *   1/2011   Jiang .................... H04R 1/2815
                                                         181/156

FOREIGN PATENT DOCUMENTS

CN          102006529 A   *   4/2011   .......... H04R 1/2815
CN          107360484 A   *   11/2017   .............. H04R 1/02
(Continued)

*Primary Examiner* — Ahmad F. Matar
*Assistant Examiner* — Sabrina Diaz
(74) *Attorney, Agent, or Firm* — Wiersch Law Group

(57)          ABSTRACT

A speaker and a rollable electronic device include a housing defining an accommodating cavity, a speaker structure arranged in the accommodating cavity, and an inverter tube arranged on the housing. A first sound outlet hole and a communicating hole are respectively in a first side wall and a second side wall of the accommodating cavity. The first side wall is connected to the second side wall. The inverter tube is connected to and extended along the second side wall. The inverter tube includes at least one inverter channel communicated with the accommodating cavity and a second sound outlet hole communicated with the at least one inverter channel. The inverter tube is retractable and stretchable along the second side wall to make the inverter tube be in a blocked state or be in a communicating state. By stretching or compressing the inverter tube, good sound experience is realized.

7 Claims, 9 Drawing Sheets

(58) Field of Classification Search
    CPC .... H04R 1/2861; H04R 1/2865; H04R 1/347;
            H04R 2499/11; H05K 5/0217; H05K
                                            5/0086
    USPC ........................ 381/338, 339, 340, 341, 349
    See application file for complete search history.

(56)                    References Cited

FOREIGN PATENT DOCUMENTS

| | | | | | |
|---|---|---|---|---|---|
| CN | 110809206 | A | * | 2/2020 | ........... H04N 9/3141 |
| CN | 110971732 | A | * | 4/2020 | ........... H04M 1/035 |
| CN | 113132836 | A | * | 7/2021 | ............... H04R 3/00 |
| CN | 113286025 | A | * | 8/2021 | ........... H04M 1/035 |
| CN | 113301191 | A | * | 8/2021 | .......... H04M 1/0268 |
| JP | S641396 | A | * | 1/1989 | ............... H04R 1/02 |

* cited by examiner

SPEAKER AND ROLLABLE ELECTRONIC DEVICE

TECHNICAL FIELD

The present disclosure relates to a technical field of electronic products, and in particular to a speaker and a rollable electronic device.

BACKGROUND

A broadcasting function of electronic products is generally realized by a speaker structure. For example, mobile phones and electronic readers are provided with a speaker. The speaker in the prior art has a fixed sound cavity, leading to a fixed acoustic performance. When this kind of speaker is applied to an electronic product such as a rollable mobile phone, a rollable e-readers, or etc., a volume of the electronic product increases when a rollable portion is pulled out for use. However, the acoustic performance of the speaker is fixed, which affects a user's acoustic experience.

Therefore, it is necessary to provide a speaker to solve above problems.

SUMMARY

A purpose of the present disclosure is to provides a speaker and a rollable electronic device. An inverter tube thereof is stretched or compressed to change an acoustic performance of the speaker, which in turn improves an acoustic experience of the rollable electronic device.

In one aspect, the present disclosure provides a speaker. The speaker comprises a housing defining an accommodating cavity, a speaker structure arranged in the accommodating cavity, and an inverter tube arranged on an outer side of the housing.

A first sound outlet hole is in a first side wall of the accommodating cavity. A communicating hole is in a second side wall of the accommodating cavity. The first side wall is connected to the second side wall. The speaker structure is capable of emitting sound waves. The inverter tube is connected to the second side wall. The inverter tube is extended along a length direction of the second side wall. The inverter tube comprises at least one inverter channel and a second sound outlet hole communicated with the at least one inverter channel. The at least one inverter channel is communicated with the accommodating cavity through the communicating hole. The second sound outlet hole faces or is opposite to the first sound outlet hole.

The inverter tube is retractable along a direction close to the second side wall to make the inverter tube be in a blocked state. The inverter tube is stretchable along a direction away from the second side wall to make the inverter tube in a communicating state.

In one optional embodiment, the inverter tube comprises a third side wall and a fourth side wall arranged opposite to the third side wall. The third side wall and the fourth side wall are arranged along a length direction of the inverter tube. The third side wall is closer to the first sound outlet hole than the fourth side wall.

The inverter tube comprises one or a plurality of inverter channels. When the one inverter channel is defined in the inverter tube, the second sound outlet hole is in the third side wall.

When the plurality of inverter channels is defined in the inverter tube, a first inverter channel of the plurality of inverter channels adjacent to the accommodating cavity is communicated with the accommodating cavity through the communicating hole. A second inverter channel of the plurality of inverter channels arranged at an outermost side of the plurality of inverter channels along the direction away from the second side wall is communicated with an outside through the second sound outlet hole. The plurality of inverter channels are separated by partitions. The partitions comprise N first partitions and M second partitions. N≥1 and M≥0. The N first partitions and the M second partitions are alternately arranged at intervals along the direction away from the second side wall. A first end of each of the first partitions is connected to the fourth side wall. A second end of each of the first partitions is spaced apart from the third side wall. A first end of each of the second partitions is connected to the third side wall. A second end of each of the second partitions is spaced apart from the fourth side wall.

N+M=K. When K is an odd number, the second sound outlet hole is on the fourth side wall. When K is an even number, the second sound outlet hole is on the third side wall.

In one optional embodiment, the partitions extend along the length direction of the second side wall.

In one optional embodiment, the inverter tube comprises a connecting hole communicated with the at least one inversion channel. The connecting hole is in a portion of the inverter tube connected with the second side wall. A projection of the connecting hole at least partially coincides with a projection of the communicating hole along a direction perpendicular to the second side wall, so the at least one inverter channel is communicated with the accommodating cavity.

A portion of an inner wall of the third side wall and a portion of an inner wall of the fourth side wall form two inner side walls of the connecting hole extending along the length direction of the inverter tube.

In one optional embodiment, a length of the second side wall is L1. A length of the inverter tube is L2. L1=L2.

In one optional embodiment, the inverter tube is a square tube.

In one optional embodiment, a bulge is arranged on the first side wall. The bulge protrudes out of the accommodating cavity. The first sound outlet hole penetrates the bulge. One side of the bulge away from the accommodating cavity defines an inclined surface. The inclined surface of the bulge is inclined with respect to a height direction of the housing.

In one optional embodiment, the first sound outlet hole comprises a first wall surface and a second wall surface spaced apart from the first wall surface. The first wall surface of the first sound outlet hole and the second wall surface of the first sound outlet hole are defined along a height direction of the housing. The first wall surface of the first sound outlet hole and the second wall surface of the first sound outlet hole are inclined with respect to a top wall surface of the accommodating cavity. A distance between the first wall surface of the first sound outlet hole and the second wall surface of the first sound outlet hole gradually increases along a direction of the first sound outlet hole away from the accommodating cavity.

In one optional embodiment, a first positioning step for installing and positioning the speaker structure is arranged in the accommodating cavity.

The first sound outlet hole comprises a first wall body and a second wall body arranged opposite to the first wall body. The first wall body and the second wall body are arranged along a length direction of the first side wall. The first wall body and the second wall body extend into the accommodating cavity to form parts of the first positioning step.

In a second aspect, the present disclosure provides a rollable electronic device. The rollable electronic device comprises the speaker mentioned above, a fixed portion, and a rollable portion.

The housing is installed on the fixed portion. The rollable portion is capable of being rolled and stored in the fixed portion and is capable of being pulled out of the fixed portion. The inverter tube is connected with the rollable portion. During a process of rolling and storing the rollable portion in the fixed portion, the rollable portions drives the inverter tube to retract along the direction close to the second side wall, so the inverter tube is in the blocked state. During a process of pulling the rollable portion out of the fixed portion, the rollable portions drives the inverter tube to stretch along the direction away from the second side wall, so the inverter tube is in the communicating state.

The present disclosure provides the speaker and the rollable electronic device. The speaker comprises the housing, the speaker structure, and the inverter tube. The speaker structure arranged in the accommodating cavity. The housing comprises the first side wall and the second side wall connected with the first side wall.

The first sound outlet hole is in the first side wall of the accommodating cavity. The communicating hole is in a second side wall of the accommodating cavity. The inverter tube is connected to the second side wall. The inverter tube is extended along the length direction of the second side wall. The inverter tube comprises the at least one inverter channel and the second sound outlet hole communicated with the at least one inverter channel. The at least one inverter channel is communicated with the accommodating cavity through the communicating hole. The second sound outlet hole faces or is opposite to the first sound outlet hole. The inverter tube is stretchable along the direction away from the second side wall to make the inverter tube in the communicating state. The inverter tube is retractable along the direction close to the second side wall to make the inverter tube in the blocked state. When the second sound outlet hole faces the first sound outlet hole, the sound waves transmitted from the second sound outlet hole and the sound waves transmitted from the first sound outlet hole are transmitted to a same side of the housing, thereby realizing phase inversions of the sound waves to form a phase inverted speaker, which increases low-frequency characteristics. When the second sound outlet hole of the inverter tube is opposite to the first sound outlet hole, the sound waves transmitted from the second sound outlet hole and the sound waves transmitted from the first sound outlet hole are transmitted outwards toward opposite sides of the housing, which realizes symmetrical stereo sound.

Figure 1:
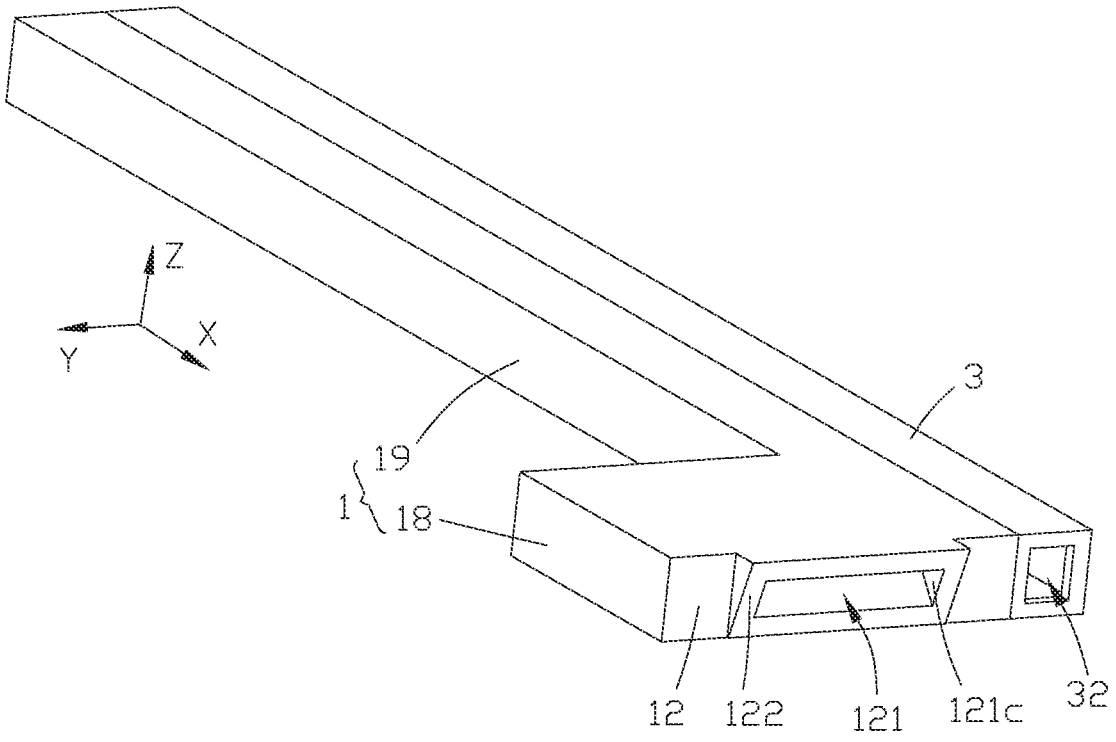
FIG. 1 is a schematic diagram of a speaker according to one specific embodiment of the present disclosure.
Figure 2:
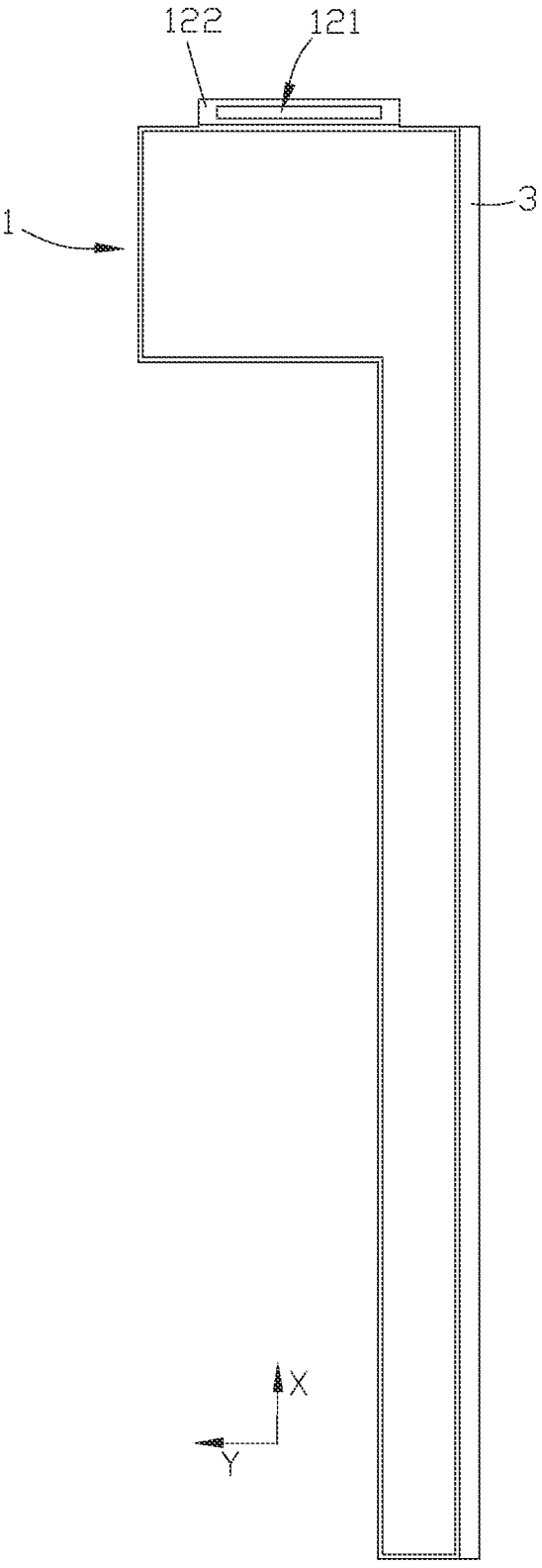
FIG. 2 is a bottom palm schematic diagram of the speaker shown in FIG. 1 where an inverter tube is in a blocked state.

In the drawings:
1—housing; 11—accommodating cavity; 12—first side wall; 121—first sound outlet hole; 121a—first wall surface; 121b—second wall surface; 121c—first wall body; 121d—second wall body; 122—bulge; 122a—inclined surface; 13—second side wall; 131—communicating hole; 14—top wall surface; 15—first positioning step; 16—main body portion; 161—second positioning step; 17—cover plate; 18—first portion; 19—second portion;
2—speaker structure;
3—inverter tube; 31—inverter channel; 32—second sound outlet hole; 33—third side wall; 34—fourth side wall; 35—partition; 351—first partition; 352—second partition; 36—connecting hole.

DETAILED DESCRIPTION

The present disclosure will be further described below with reference to the accompanying drawings and embodiments.

The present disclosure provides a speaker and a rollable electronic device including the speaker. The speaker is a transducer device converting an electrical signal into an acoustic signal. The rollable electronic device may be a rollable mobile phone, a rollable e reader, and the like.

As shown in FIGS. 1-8, the speaker comprises a housing 1, a speaker structure 2, and an inverter tube 3. The housing 1 defines an accommodating cavity 11. A first sound outlet hole 121 is in a first side wall 12 of the accommodating cavity 11. A communicating hole 131 is in a second side wall 13 of the accommodating cavity 11. The first side wall 12 is connected to the second side wall 13. The speaker structure 2 is arranged in the accommodating cavity 11 and the speaker structure 2 is capable of emitting sound waves.

The inverter tube 3 is arranged on an outer side of the housing 1. The inverter tube 3 is connected to the second side wall 13. The inverter tube 3 is extended along a length direction of the second side wall 13. The inverter tube 3 comprises at least one inverter channel 31 and a second sound outlet hole 31 communicated with the at least one inverter channel 31. The at least one inverter channel 31 is communicated with the accommodating cavity 11 through the communicating hole 131. The second sound outlet hole 32 faces or is opposite to the first sound outlet hole 121. The inverter tube 3 is retractable along a direction close to the second side wall 13 to make the inverter tube 3 be in a blocked state. The inverter tube 3 is stretchable along a direction away from the second side wall 13 to make the inverter tube 3 be in a communicating state.

When the speaker structure 2 works and the inverter tube 3 is stretched in the direction away from the second side wall 13 to be in the communicating state, the speaker structure 2 emits sound waves, and the sound waves are transmitted to an outside of the housing 1. The sound waves are also transmitted to the at least one inverter channel 31 through the communicating hole 13.

When the second sound outlet hole 32 of the inverter tube 3 faces the first sound outlet hole 121, the sound waves transmitted from the second sound outlet hole 32 and the sound waves transmitted from the first sound outlet hole 121 are transmitted to a same side of the housing, thereby realizing phase inversions of the sound waves to form a phase inverted speaker, which increases low-frequency characteristics. When the second sound outlet hole 32 of the inverter tube 3 is opposite to the first sound outlet hole 121, the sound waves transmitted from the second sound outlet hole 32 and the sound waves transmitted from the first sound outlet hole 121 are transmitted outwards toward two opposite sides of the housing 1, which realizes symmetrical stereo sound.

The inverter tube 3 is a flexible tube. When the inverter tube 3 is compressed along the direction close to the second side wall 13, the inverter tube 3 is collapsed, so that the inverter tube 3 is in the blocked state. At this time, the sound waves emitted by the speaker structure 2 no longer transmit through the inverter tube 3 and the sound waves only transmit from the first sound outlet hole 121 to the outside. That is, the speaker is a closed speaker when the inverter tube 3 is in the blocked state. When the inverter tube 3 is stretched in the direction away from the second side wall 13, the inverter tube 3 is switched from a collapsed state to a normal state. That is, when the inverter tube 3 is in the communicating state, the sound waves emitted by the speaker structure 2 transmit to the inverter tube 3 and transmit to the outside from the second sound outlet hole 32, and the sound wave also transmit from the first sound outlet hole 121 to the outside, which improves a user sound experience.

The rollable electronic device of the embodiment further comprises a fixed portion and a rollable portion. The rollable portion is capable of being rolled and stored in the fixed portion and is capable of being pulled out of the fixed portion. The housing 1 is installed on the fixed portion. The inverter tube 3 is connected with the rollable portion. When the rollable portion needs to be used, the rollable portion is pulled out of the fixed portion. A pulling action is operated by a driving member such as a motor or pulling by manpower. During a process of pulling out the rollable portion, the inverter tube 3 is stretched along the direction away from the second side wall 13, so the inverter tube 3 is in the communicating state.

When the second sound outlet hole 32 of the inverter tube 3 faces the first sound outlet hole 121, the sound waves emitted by the speaker structure 2 transmit to the outside through the inverter tube 3, which increases low-frequency characteristics. Thus, a good acoustic experience is realized when the rollable portion of the rollable electronic device is pulled out and a volume of the rollable electronic device is increased. When the second sound outlet hole 32 is opposite to the first sound outlet hole 121, the sound waves transmitted from the second sound outlet hole 32 and the sound waves transmitted from the first sound outlet hole 121 are transmitted outwards toward the two opposite sides of the housing 1, which realizes the symmetrical stereo sound. When the rollable portion is not used, the rollable portion is pushed back so that the rollable portion is rolled and is stored in the fixed portion. A rolling action is operated by the driving member such as the motor or pulling by manpower. During a process of rolling and storing the rollable portion in the fixed portion, the inverter tube 3 is compressed along a direction close to an outer side wall of the housing 1, so the inverter tube 3 is in the blocked state. At this time, the rollable electronic device returns to an undeformed state, and the sound waves emitted by the speaker structure 2 no longer transmit from the inverter tube 3, but are transmitted to the outside through the first sound outlet hole 121 of the housing 1, so that the speaker emits sound meeting needs of the rollable electronic device in the undeformed state.

In addition, the speaker structure 2 adopts a structure in the prior art and its internal specific structure is not repeated herein.

Specifically, as shown in FIGS. 3-8, the inverter tube 3 comprises a third side wall 33 and a fourth side wall 34 arranged opposite to the third side wall 33. The third side wall 33 and the fourth side wall 34 are arranged along a length direction X of the inverter tube 3. The third side wall 33 is closer to the first sound outlet hole 121 than the fourth side wall 34. The inverter tube 3 comprises one or a plurality of inverter channels 31. When only one inverter channel 31 is defined in the inverter tube 3, the second sound outlet hole 32 is in the third side wall 33.

When the plurality of inverter channels 31 is defined in the inverter tube 3, a first inverter channel 31 of the plurality of inverter channels 31 adjacent to the accommodating cavity 11 is communicated with the accommodating cavity 11 through the communicating hole 131. A second inverter channel 31 of the plurality of inverter channels 31 arranged at an outermost side of the plurality of inverter channels 31 along the direction away from the second side wall is communicated with the outside through the second sound outlet hole 32. The plurality of inverter channels 31 are separated by partitions 35. The partitions 35 comprise N first partitions 351 and M second partitions 352. $N \geq 1$ and $M \geq 0$. The N first partitions 351 and the M second partitions 352 are alternately arranged at intervals along the direction away from the second side wall 13. A first end of each of the first partitions 351 is connected to the fourth side wall 34. A second end of each of the first partitions 351 is spaced apart from the third side wall 33. A first end of each of the second partitions 352 is connected to the third side wall 33. A second end of each of the second partitions 352 is spaced apart from the fourth side wall 34. N+M=K. When K is an odd number, the second sound outlet hole 32 is in the fourth side wall 34. When K is an even number, the second sound outlet hole 32 is in the third side wall 33.

Figure 3:
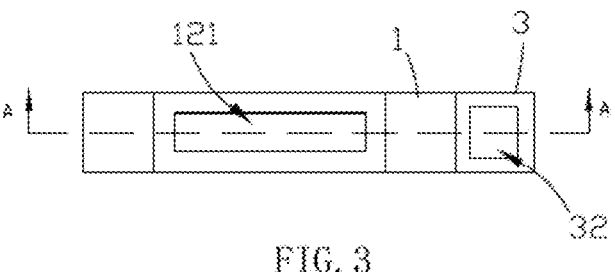
FIG. 3 is a front side elevation view of the speaker shown in FIG. 1 where the inverter tube is in a communicating state and has one inverter channel.
Figure 4:
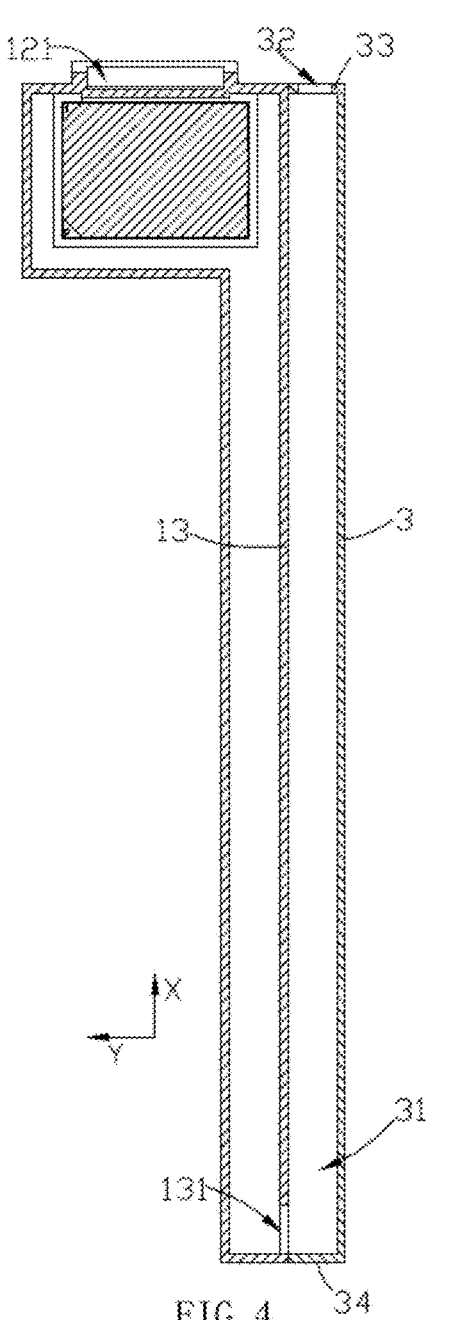
FIG. 4 is a cross-sectional schematic diagram taken along the line A-A shown in FIG. 3.

As shown in FIGS. 3 and 4, when the inverter tube 3 comprises only one inverter channel 31, the second sound outlet hole 32 is in the third side wall 33. That is, the second sound outlet hole 32 faces the first sound outlet hole 121. When the speaker structure works and emits the sound waves, the sound waves transmitted from the second sound outlet hole 32 and the sound waves transmitted from the first sound outlet hole 121 are transmitted to the same side of the housing, thereby realizing the phase inversions of the sound waves.

Figure 5:
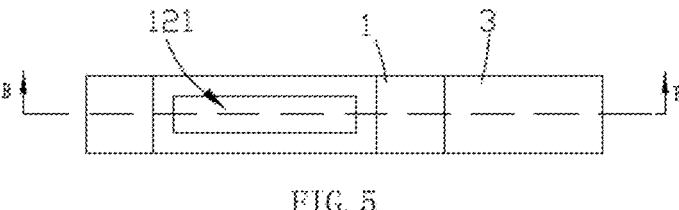
FIG. 5 is a front side elevation view of the speaker according to another specific embodiment where the inverter tube is in the communicating state and has two inverter channels.
Figure 6:
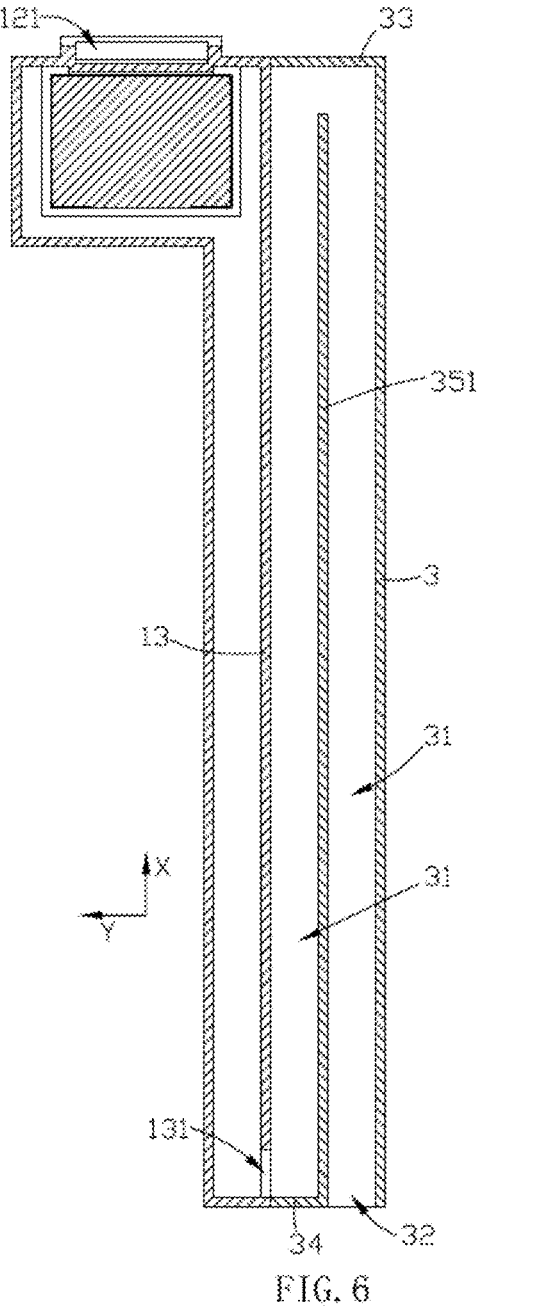
FIG. 6 is a cross-sectional schematic diagram taken along the line B-B shown in FIG. 5.

As shown in FIGS. 5 and 6, the inverter tube 3 comprises two inverter channels 31. One of the inverter channels 31 adjacent to the accommodating cavity 11 is defined as the first inverter channel, and the other inverter channel adjacent to the first inverter channel is defined as the second inverter channel. The first inverter channel is communicated with the accommodating cavity 11 through the communicating hole 131. The second inverter channel is communicated with the outside through the second sound outlet hole 32, and the second sound outlet hole 32 is arranged in one side away from the first sound outlet hole 121. The first inverter channel and the second inverter channel are separated by the first partition 351. The first end of the first partition is connected with the fourth side wall 34, and the second end of the first partition is spaced apart from the third side wall 33. When the speaker structure works and emits the sound waves, the sound waves are transmitted to the first inverter channel from the communicating hole 131, are transmitted to the second inverter channel from a space between the first partition 351 and the third side wall 33, and are finally transmitted to the outside from the second sound outlet hole 32. Therefore, the sound waves transmitted from the second sound outlet hole 32 and the sound waves transmitted from the first sound outlet hole 121 are transmitted outwards toward the two opposite sides of the housing 1, which realizes the symmetrical stereo sound.

Figure 7:
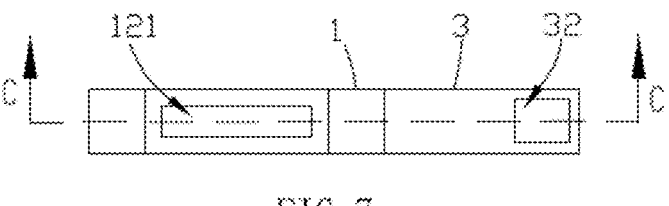
FIG. 7 is a front side elevation view of the speaker according to another specific embodiment where the inverter tube is in the communicating state and has three inverter channels.
Figure 8:
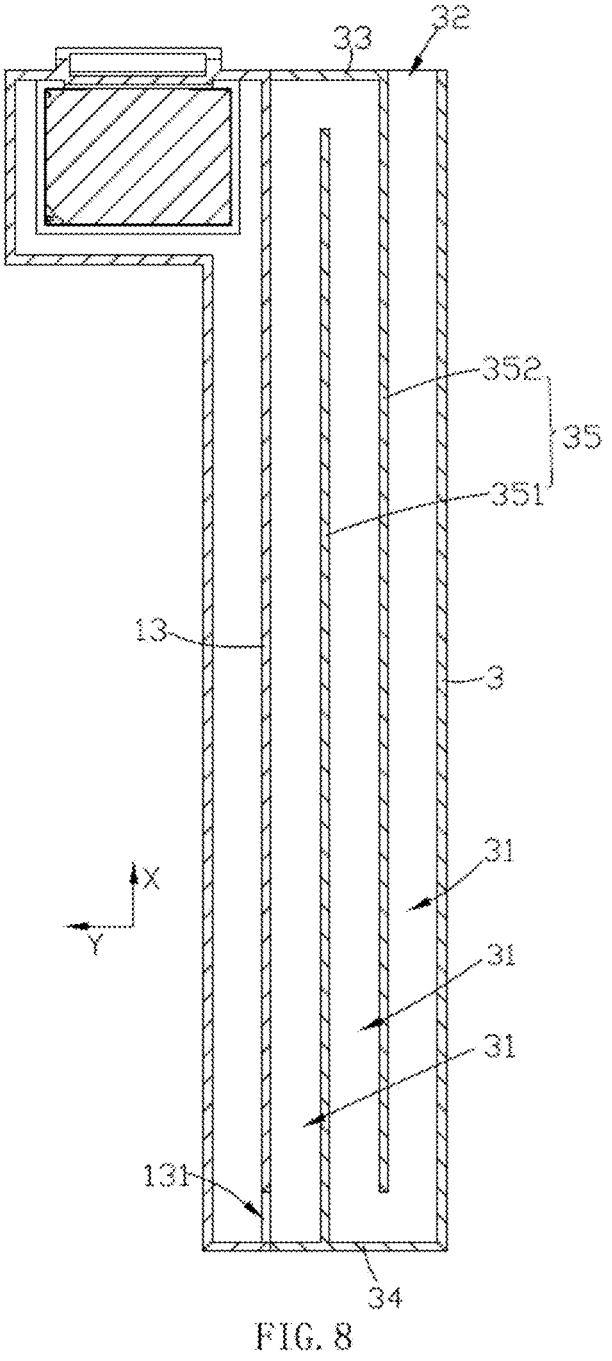
FIG. 8 is a cross-sectional schematic diagram taken along the line C-C shown in FIG. 7.

As shown in FIGS. 7 and 8, the inverter tube 3 comprises three inverter channels 31. The three inverter channels 31 are respectively defined as the first inverter channel, a third inverter channel, and the second inverter channel along the direction away from the second side wall 13. When the speaker structure 2 works and emits the sound waves, the sound waves are transmitted to the first inverter channel from the communicating hole 131, then the sound waves are transmitted to the third inverter channel from the space between the first partition 351 and the third side wall 33, and the sound waves are transmitted to the second inverter channel from the space between the second partition 352 and the fourth side wall 34. Finally, the sound waves are transmitted to the outside from the second sound outlet hole 32. Therefore, the sound waves transmitted from the second sound outlet hole 32 and the sound waves transmitted from the first sound outlet hole 121 are transmitted outwards toward the same sides of the housing 1, which realizes the phase inversions of the sound waves.

Specifically, as shown in FIG. 4, the partitions 35 extend along the length direction X of the second side wall 13. Thus, an internal structure of the inverter tube 3 is simple, and the manufacture of the inverter tube 3 is facilitated.

Figure 9:
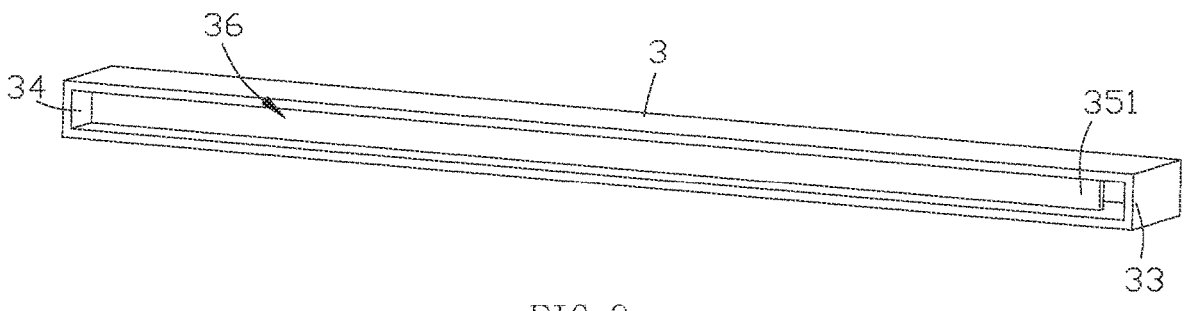
FIG. 9 is a schematic diagram of the inverter tube of the speaker shown in FIG. 1 according to one specific embodiment of the present disclosure.
Figure 11:
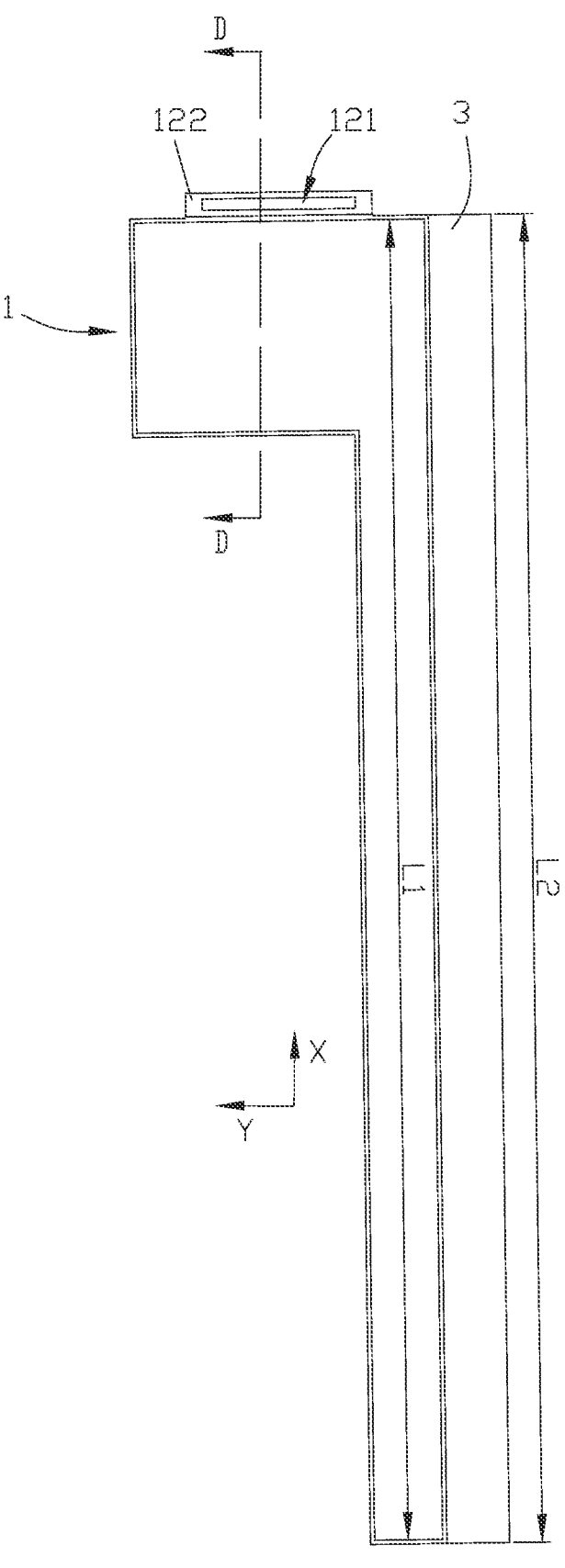
FIG. 11 is a bottom palm schematic diagram of the speaker shown in FIG. 1 where the inverter tube is in the communicating state.

In one specific embodiment, as shown in FIG. 9, the inverter tube 3 comprises a connecting hole 36 communicated with the inversion channels 31. The connecting hole 36 is in a portion of the inverter tube 3 connected with the second side wall 13. A projection of the connecting hole 36 at least partially coincides with a projection of the communicating hole 131 along a direction perpendicular to the second side wall 13, so the inverter channels 31 are communicated with the accommodating cavity 11. A portion of an inner wall of the third side wall 33 and a portion of an inner wall of the fourth side wall 34 form two inner side walls of the connecting hole 36 extending along the length direction X of the inverter tube 3. In one specific embodiment, as shown in FIG. 11, a length of the second side wall 13 is L1. A length of the inverter tube 3 is L2. L1=L2, which further improves connection stability between the inverter tube 3 and the second side wall 13.

In the embodiment, the inverter tube 3 is a square tube, so the inverter tube is easily in the blocked state when the inverter tube is compressed and is easily in the communicating state when the inverter tube is stretched. In other embodiments, the inverter tube 3 may be a round tube.

In a specific embodiment, as shown in FIG. 1, the housing 1 comprises a first portion 18 and a second portion 19 connected to the first portion. The first sound outlet hole 121 is in the first portion 18, and the communicating hole 131 is in the second portion 18. Namely, a portion of the second side wall 13 is defined on the first portion 18 and the other portion of the second side wall 13 is defined on the second portion 19. The second portion 19 extends along the length direction X of the second side wall 13, so that a length of the inverter tube 3 satisfies use needs.

In one specific embodiment, as shown in FIG. 1, a bulge 122 is arranged on the first side wall 12. The bulge 122 protrudes out of the accommodating cavity 11. The first sound outlet hole 121 penetrates the bulge 122, which facilitates transmission of the sound waves to the outside through the first sound outlet hole 121, and is beneficial to improve the user's sound experience.

Figure 12:
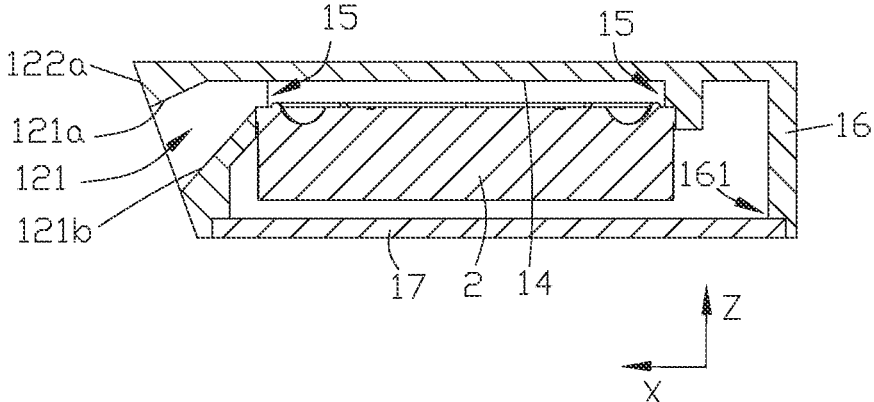
FIG. 12 is a cross-sectional schematic diagram taken along the line D-D shown in FIG. 11.

As shown in FIG. 12, one side of the bulge 122 away from the accommodating cavity 11 defines an inclined surface 122a. The inclined surface 122a of the bulge 122 is inclined with respect to a height direction of the housing 1. The first sound outlet hole 121 penetrates the bulge 122, which makes the sound waves emitted from the first sound outlet hole 121 be intensively transmitted to a required area.

Specifically, as shown in FIG. 12, a cross-sectional area of the first sound outlet hole 121 is gradually increased along a direction of the first sound outlet hole 121 away from the accommodating cavity 11, so that the sound waves are reflected by an inner wall of the first sound outlet hole 121, which makes transmission directions of the sound waves more concentrated.

Specifically, the first sound outlet hole 121 comprises a first wall surface 121a and a second wall surface 121b spaced apart from the first wall surface 121a. The first wall surface 121a of the first sound outlet hole 121 and the second wall surface 121b of the first sound outlet hole 121 are defined along a height direction Z of the housing 1. The first wall surface 121a of the first sound outlet hole 121 and the second wall surface 121b of the first sound outlet hole 121 are inclined with respect to a top wall surface 14 of the housing. A distance between the first wall surface 121a of the first sound outlet hole 121 and the second wall surface 121b of the first sound outlet hole 121 gradually increases along a direction of the first sound outlet hole 121 away from the accommodating cavity 11. When the sound waves are transmitted to the first sound outlet hole 121, the sound waves are reflected by the first wall surface 121a and the second wall surface 121b, so that the transmission directions of the sound waves are concentrated.

In one specific embodiment, as shown in FIGS. 10 and 12-14, a first positioning step 15 for installing and positioning the speaker structure 2 is arranged in the accommodating cavity 11 along a height direction Z of the housing 1. Thus, the speaker structure 2 is arranged in the accommodating cavity 11.

The first sound outlet hole 121 comprises a first wall body 121c and a second wall body 121d arranged opposite to the first wall body 121c. The first wall body 121c and the second wall body 121d are arranged along a length direction Y of the first side wall 12. The first wall body 121c and the second wall body 121d extend into the accommodating cavity 11 to form portions of the first positioning step 15.

After the speaker structure 2 abuts against the first positioning step 15, the speaker structure 2 reaches an installation position. Since the first wall body 121c and the second wall body 121d extend into the accommodating cavity 11 to form portions of the first positioning step 15, the installation position of the speaker structure 2 is closer to the first sound outlet hole 121, which is convenient for the sound waves emitted by the speaker structure 2 to be transmitted from the first sound outlet hole 121 to the outside.

Figure 10:
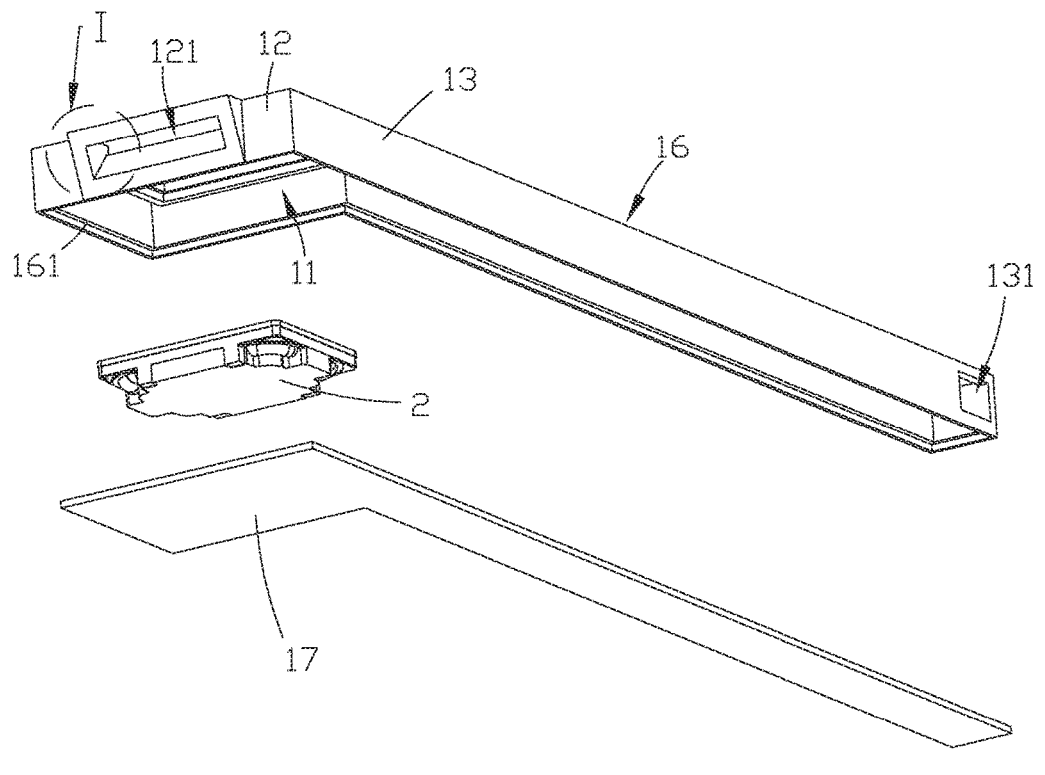
FIG. 10 is an exploded schematic diagram of a housing and a speaker structure of the speaker shown in FIG. 1.

In one specific embodiment, as shown in FIG. 10, the housing 1 comprises a main body portion 16 and a cover plate 17. The main body portion 16 defines an opening and the speaker structure 2 is extended into the main body portion 16 through the opening. The cover plate 17 covers on the main body portion 16 and is detachably connected to the main body portion 16. When the speaker structure 2 needs to be replaced or repaired, the cover plate 17 is removed from the main body portion 16, which facilitates replacement of the speaker structure 2.

Figure 13:
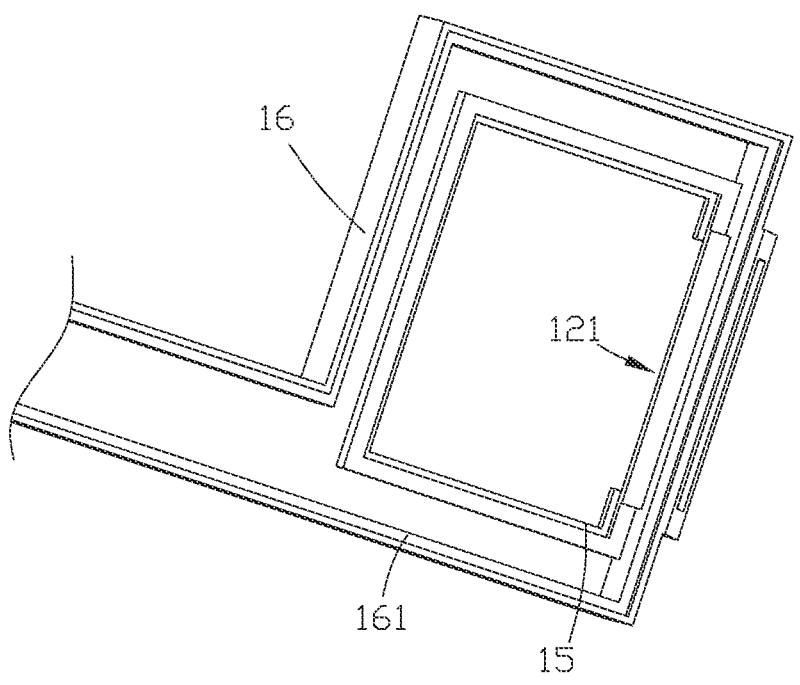
FIG. 13 is a schematic diagram of a main portion shown in FIG. 10.
Figure 14:
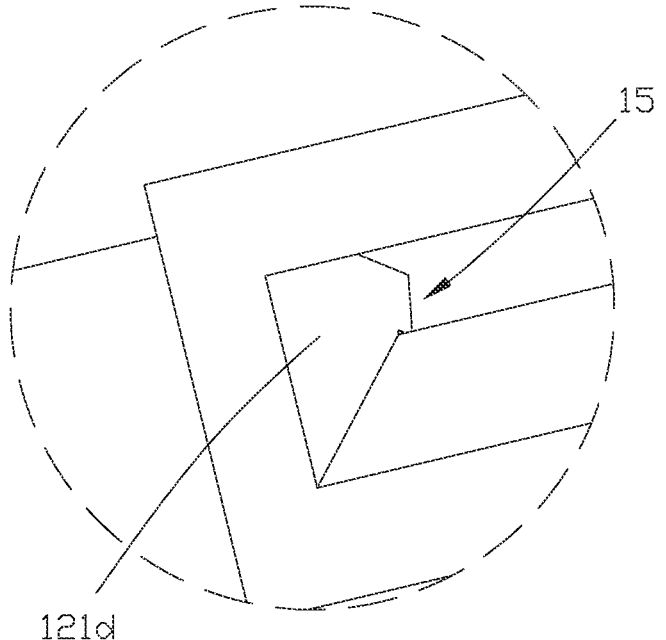
FIG. 14 is an enlarged view of area I shown in FIG. 10.

Specifically, as shown in FIG. 13, a second positioning step 161 for installing and positioning the cover plate 17 is arranged on an inner wall of the main body portion 16, which facilitates installation of the cover plate 17.

Specifically, a projection of the second positioning step 161 along the height direction Z of the housing 1 is same as an edge shape of a projection of the cover plate 17. That is, when the cover plate 17 is installed on the main body portion 16, second positioning step 161 is arranged around the cover plate 17, which improves installation stability of the cover plate 17.

The above are only the embodiments of the present disclosure. It should be pointed out that for those of ordinary skill in the art, improvements can be made without departing from the inventive concept of the present disclosure, and the improvements fall within a protection scope of the present disclosure.

What is claimed is:

1. A speaker, comprising:
a housing defining an accommodating cavity;
a speaker structure arranged in the accommodating cavity; and
an inverter tube arranged on an outer side of the housing;
wherein a first sound outlet hole is in a first side wall of the accommodating cavity; a communicating hole is in a second side wall of the accommodating cavity; the first side wall is connected to the second side wall; the speaker structure is capable of emitting sound waves; the inverter tube is connected to the second side wall; the inverter tube is extended along a length direction of the second side wall; the inverter tube comprises at least one inverter channel and a second sound outlet hole communicated with the at least one inverter channel; the at least one inverter channel is communicated with the accommodating cavity through the communicating hole; the inverter tube comprises a third side wall and a fourth side wall that are arranged opposite to each other along the length direction of the second side wall, and the third side wall is closer to the first sound outlet hole than the fourth side wall; the third side wall is arranged adjacent to the first side wall side by side; the communicating hole is arranged adjacent to the fourth side wall; the second sound outlet hole is in the third side wall or in the fourth side wall; when the second sound outlet hole is in the third side wall, the second sound outlet hole and the first sound outlet hole are arranged on the same side of the speaker; when the second sound outlet hole is in the fourth side wall, the second sound outlet hole and the first sound outlet hole are arranged on two opposite sides of the speaker;
wherein the inverter tube has two usage states that are a blocked state and a communicating state; when the inverter tube is retracted along a direction close to and perpendicular to the second side wall so as to make the at least one inverter channel disappears, the inverter tube is in the blocked state; when the inverter tube is stretched along a direction away from and perpendicular to the second side wall so as to make the at least one inverter channel forms, the inverter tube is in the communicating state.

2. The speaker according to claim 1,
wherein the inverter tube comprises one or a plurality of inverter channels; when the one inverter channel is defined in the inverter tube, the second sound outlet hole is in the third side wall;
when the plurality of inverter channels is defined in the inverter tube, a first inverter channel of the plurality of inverter channels adjacent to the accommodating cavity is communicated with the accommodating cavity through the communicating hole; a second inverter channel of the plurality of inverter channels arranged at an outermost side of the plurality of inverter channels along the direction away from the second side wall is communicated with an outside through the second sound outlet hole; the plurality of inverter channels are separated by partitions extending along the length direction of the second side wall; the partitions comprise N first partitions and M second partitions; N≥1 and M≥0; the N first partitions and the M second partitions are alternately arranged at intervals along the direction away from and perpendicular to the second side wall; a first end of each of the first partitions is connected to the fourth side wall; a second end of each of the first partitions is spaced apart from the third side wall; a first end of each of the second partitions is connected to the third side wall; a second end of each of the second partitions is spaced apart from the fourth side wall;
wherein N+M=K; when K is an odd number, the second sound outlet hole is in the fourth side wall; when K is an even number, the second sound outlet hole is in the third side wall.

3. The speaker according to claim 1, wherein a length of the second side wall is L1; a length of the inverter tube is L2; L1=L2.

4. The speaker according to claim 1, wherein a bulge is arranged on the first side wall; the bulge protrudes out of the accommodating cavity; the first sound outlet hole penetrates the bulge; one side of the bulge away from the accommodating cavity defines an inclined surface; the inclined surface of the bulge is inclined with respect to a height direction of the housing.

5. The speaker according to claim 1, wherein the first sound outlet hole comprises a first wall surface and a second wall surface spaced apart from the first wall surface; the first wall surface of the first sound outlet hole and the second wall surface of the first sound outlet hole are defined along a height direction of the housing; the first wall surface of the first sound outlet hole and the second wall surface of the first sound outlet hole are inclined with respect to a top wall surface of the accommodating cavity; a distance between the first wall surface of the first sound outlet hole and the second wall surface of the first sound outlet hole gradually increases along a direction of the first sound outlet hole away from the accommodating cavity.

6. The speaker according to claim 1, wherein a first positioning step for installing and positioning the speaker structure is arranged in the accommodating cavity;
wherein the first sound outlet hole comprises a first wall body and a second wall body arranged opposite to the first wall body; the first wall body and the second wall body are arranged along a length direction of the first side wall; the first wall body and the second wall body extend into the accommodating cavity to form parts of the first positioning step.

7. A rollable electronic device, comprising:

the speaker according to claim 1;

a fixed portion; and a rollable portion;

wherein the housing is installed on the fixed portion; the rollable portion is capable of being rolled and stored in the fixed portion and is capable of being pulled out of the fixed portion; the inverter tube is connected with the rollable portion; during a process of rolling and storing the rollable portion in the fixed portion, the rollable portion drives the inverter tube to retract along the direction close to and perpendicular to the second side wall so as to make the at least one inverter channel disappears, so the inverter tube is in the blocked state; during a process of pulling the rollable portion out of the fixed portion, the rollable portion drives the inverter tube to stretch along the direction away from and perpendicular to the second side wall so as to make the at least one inverter channel forms, so the inverter tube is in the communicating state.

* * * * *